(12) United States Patent
Cheung et al.

(10) Patent No.: US 7,375,563 B1
(45) Date of Patent: May 20, 2008

(54) DUTY CYCLE CORRECTION USING INPUT CLOCK AND FEEDBACK CLOCK OF PHASE-LOCKED-LOOP (PLL)

(75) Inventors: Hung-Yan Cheung, San Jose, CA (US); Michael Y. Zhang, Palo Alto, CA (US)

(73) Assignee: Pericom Semiconductor Corp., San Jose, CA (US)

( * ) Notice: Subject to any disclaimer, the term of this patent is extended or adjusted under 35 U.S.C. 154(b) by 0 days.

(21) Appl. No.: 11/308,568

(22) Filed: Apr. 7, 2006

(51) Int. Cl.
*H03L 7/06* (2006.01)

(52) U.S. Cl. ............... 327/156; 327/147; 327/175; 327/176

(58) Field of Classification Search ........ 327/154–157, 327/159–160, 162–163, 165–166, 170, 173–176, 327/141, 144–148, 150, 24, 208–212, 218
See application file for complete search history.

(56) References Cited

U.S. PATENT DOCUMENTS

| | | | | |
|---|---|---|---|---|
| 5,347,232 A | * | 9/1994 | Nishimichi | 331/1 A |
| 5,638,016 A | * | 6/1997 | Eitrheim | 327/175 |
| 5,812,619 A | * | 9/1998 | Runaldue | 375/376 |
| 5,883,534 A | * | 3/1999 | Kondoh et al. | 327/156 |
| 5,942,947 A | | 8/1999 | Bhagwan | 331/8 |
| 5,987,085 A | | 11/1999 | Anderson | 375/374 |
| 6,295,328 B1 | * | 9/2001 | Kim et al. | 375/376 |
| 6,320,437 B1 | | 11/2001 | Ma | 327/175 |
| 6,351,508 B1 | | 2/2002 | Shishkoff et al. | 375/375 |
| 6,433,645 B1 | * | 8/2002 | Mann et al. | 331/18 |
| 6,452,432 B2 | * | 9/2002 | Kim | 327/158 |
| 6,496,045 B1 | | 12/2002 | Nguyen | 327/115 |
| 6,583,657 B1 | | 6/2003 | Eckhardt et al. | 327/175 |
| 6,822,497 B1 | * | 11/2004 | Yao et al. | 327/291 |
| 2005/0275473 A1 | | 12/2005 | Thies et al. | 331/34 |
| 2006/0012441 A1 | | 1/2006 | Maneatis | 331/16 |

* cited by examiner

*Primary Examiner*—Tuan T. Lam
*Assistant Examiner*—Patrick O'Neill
(74) *Attorney, Agent, or Firm*—gPatent LLC; Stuart T. Auvinen

(57) ABSTRACT

A clock generator corrects the duty cycle of an input clock. The input clock has a poor duty cycle such as less than 50%. The input clock is applied to a phase detector of a phase-locked loop (PLL). A voltage-controlled oscillator (VCO) of the PLL drives a feedback clock that is also applied to the phase detector. An edge-triggered set-reset SR flip-flop generates a duty-cycle-corrected output clock. The SR flip-flop is set by the leading edge of the input clock, but is reset by the trailing edge of the feedback clock. The VCO generates the feedback clock with the desired duty cycle, such as 50%. The leading edge of the output clock is generated by the input clock, avoiding noise generated by the PLL, while the trailing edge of the output clock is generated by the feedback clock and has PLL noise, but corrects for the desired duty cycle.

9 Claims, 6 Drawing Sheets

DUTY CYCLE CORRECTION USING INPUT CLOCK AND FEEDBACK CLOCK OF PHASE-LOCKED-LOOP (PLL)

FIELD OF THE INVENTION

This invention relates to clock generators, and more particularly to duty-cycle correction of clocks using a Phase-Locked Loop (PLL).

BACKGROUND OF THE INVENTION

Electronic systems are often synchronous or clocked. These systems may rely on accurate clocks to synchronize the timing of operations and data transfers. A crystal oscillator can be used to generate a clock at a base frequency, which is then divided or multiplied to create one or more clocks with desired frequencies. An external clock can be received and likewise divided or multiplied to produce internal clocks.

Clocks are sometimes generated from oscillator outputs using phase-locked loops (PLL's). PLLs are one of the most widely used building blocks in digital systems today. FIG. 1 illustrates a typical PLL. Phase detector 10 receives a reference-clock input IN from an external oscillator or clock source. The phase and frequency of the reference clock IN is compared to the phase and frequency of a feedback clock FB generated by voltage-controlled oscillator (VCO) 14. The feedback clock can be the output clock generated by the PLL, or a divided-down derivative of the output clock from VCO 14 such as produced by feedback counter 16.

Phase detector 10 outputs up and down signals UP, DN when the phase or frequency of one input does not match the phase or frequency of the other input. These up and down signals cause charge pump 12 to add or remove charge from filter capacitor 20, which integrates the charge. As charge is added or removed through resistor 21 from filter capacitor 20, the voltage input $V_{CTL}$ to VCO 14 is increased or decreased. VCO 14 responds by increasing or decreasing the frequency of the output clock. The feedback clock to phase detector 10 through counter 16 is likewise changed by VCO 14.

As charge pump 12 adds or removes charge from filter capacitor 20, altering control voltage $V_{CTL}$ input to VCO 14, the phase and frequency of the feedback clock are adjusted until the reference clock is matched. Then phase detector 10 stops generating up and down signals to charge pump 12, until charge leaks off filter capacitor 20 or the reference clock changes.

FIG. 2 is a timing diagram of clock, such as input IN to a PLL. The duty cycle of the clock may not be exactly 50%-50%. The high pulse width TH is shorter than the low pulse width TL in this example. The resulting duty cycle is about 30-70 rather than the more ideal 50-50.

Some systems are quite sensitive to the duty cycle of a clock. System chips and microprocessors may require the duty cycle to be within 5% of 50-50. When the high or low pulse width is too short, internal logic such as registers may fail to fully flip logic states, resulting in logical errors or other failures.

The output clock of a PLL could be used to correct a duty cycle of an input clock that is not 50-50. However, a PLL may introduce noise or phase errors into its output or feedback clock. Thus the quality of a PLL's output or feedback clock is not as good as its input clock.

What is desired is a PLL that can be used to correct clock duty cycles. A duty cycle correcting circuit that uses a PLL but still produces a duty-cycle-corrected clock that has the good noise profile of an input clock is desirable.

DETAILED DESCRIPTION

The present invention relates to an improvement in duty-cycle correctors. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The inventor has realized that a PLL may be used to correct duty cycle. The input clock to the PLL may still be used to produce a corrected clock with the better noise profile of the input clock, while using the feedback clock from the PLL to correct the duty cycle. A set-reset latch can produce the corrected clock. One clock edge is generated by the input clock, while the other clock edge is produced by the PLL feedback clock.

The input clock produces a clock edge with good noise immunity, which is ideal for the leading edge. The feedback clock produces a clock with degraded noise from the PLL, but can be used to generate the trailing edge. Thus the leading edge has good noise immunity, while the noisier trailing edge produces the correct duty cycle.

Figure 1:
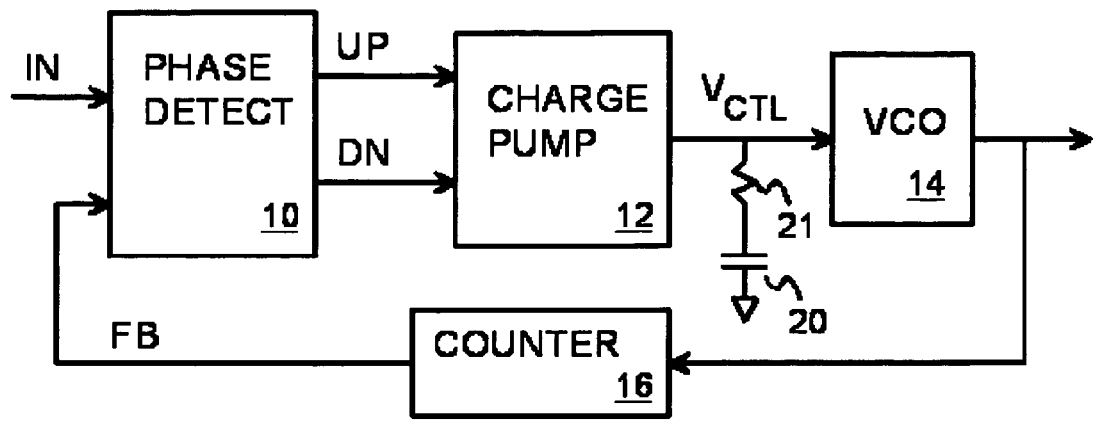
FIG. 1 illustrates a typical PLL.
Figure 2:
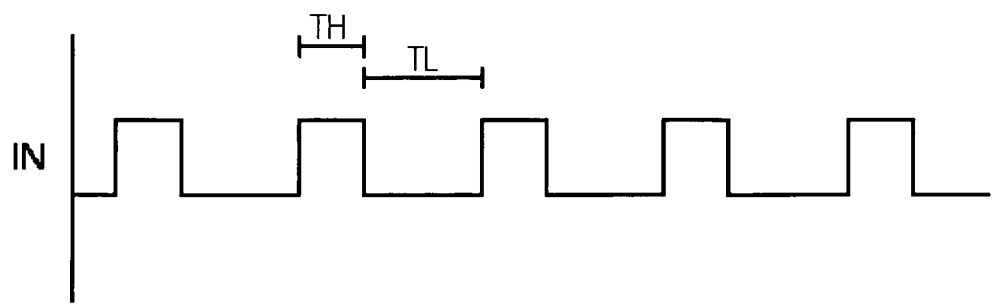
FIG. 2 is a timing diagram of clock, such as input clock IN to a PLL.
Figure 3:
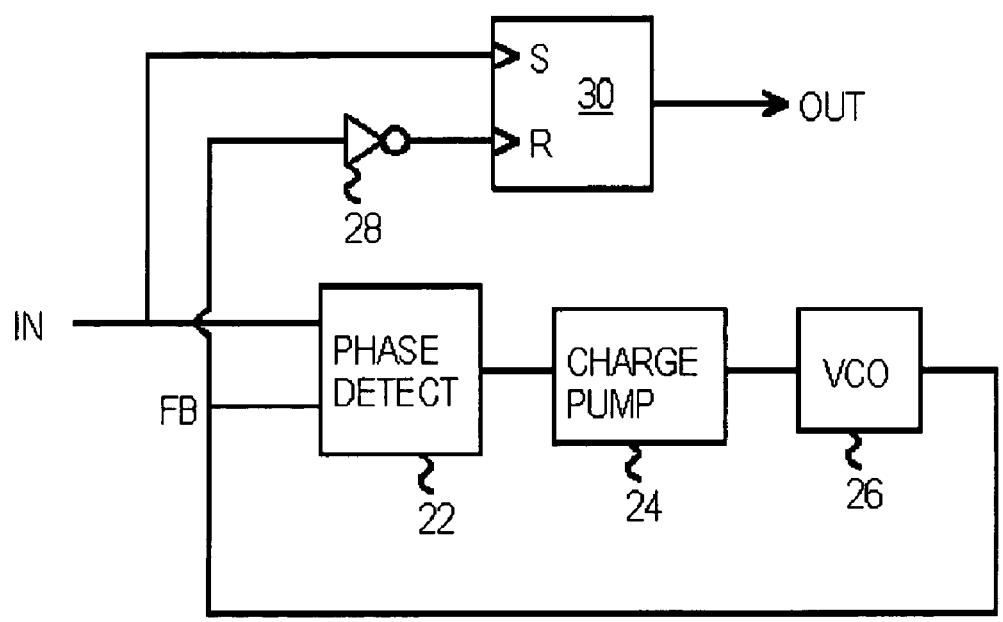
FIG. 3 is a block diagram of a duty cycle corrector with a PLL and set-reset latch.

FIG. 3 is a block diagram of a duty cycle corrector with a PLL and set-reset latch. A PLL includes phase detector 22, charge pump 24, and voltage-controlled oscillator VCO 26. A filter such as a capacitor or capacitor and resistor may be placed between charge pump 24 and VCO 26, but is not shown.

Phase detector 22 compares the phase and frequency of input clock IN and feedback clock FB from VCO 26 and causes charge pump 24 to charge and discharge a control voltage into VCO 26. VCO 26 adjusts the frequency of clock FB to compensate. Some noise is introduced into feedback clock FB that is not present in input clock IN by the operation of phase detector 22, charge pump 24, and VCO 26.

Set-reset SR flip-flop 30 is an edge-triggered SR latch. The rising edge of input clock IN causes SR flip-flop 30 to set and drive output clock OUT high. The falling edge of feedback clock FB is inverted by inverter 28 and causes SR flip-flop 30 to reset and drive output clock OUT low.

Since the set input to SR flip-flop 30 is generated from input clock IN, PLL noise is not introduced into the rising edge of output clock OUT. However, since the reset input to SR flip-flop 30 is generated from feedback clock FB, PLL noise is introduced into the falling edge of output clock OUT.

Since VCO 26 generates a clock with approximately 50-50 duty cycle, feedback clock FB has an approximate 50-50 duty cycle. Since phase detector 22, operating with the PLL loop, causes feedback clock FB to be in phase alignment with clock IN, the duty cycle of output clock OUT generated by SR flip-flop 30 is corrected to 50-50 by the falling edge of feedback clock FB.

Figure 4:
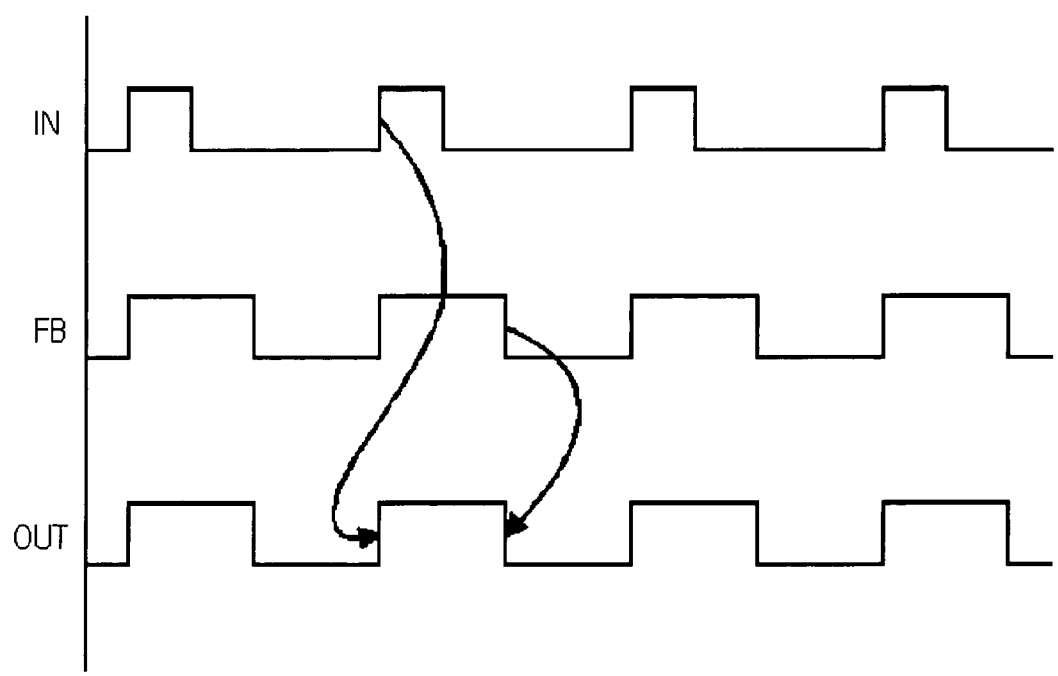
FIG. 4 is a waveform diagram of operation of the duty-cycle corrector of FIG. 3.

FIG. 4 is a waveform diagram of operation of the duty-cycle corrector of FIG. 3. The rising edge of input clock IN sets SR flip-flop 30, creating the rising edges of output clock OUT. The falling edge of feedback clock FB resets SR flip-flop 30 and generates the falling edges of output clock OUT.

The PLL ensures that the rising edges of input clock IN and feedback clock FB are aligned, even though the falling edges are not aligned. Since the VCO generates feedback clock FB with a near 50-50 duty cycle, the resulting output clock OUT has a near 50-50 duty cycle.

When viewed on a scope or analyzer, the rising edges of clocks IN and OUT may appear sharper than the falling edge of OUT. Both rising and falling edges of feedback clock FB may also appear somewhat fuzzier than input clock IN. The fuzzier edges are caused by noise introduced by the PLL. This relative fuzziness may not always be visible, depending on the implementation, environment, and test equipment and lab set up.

Figure 5:
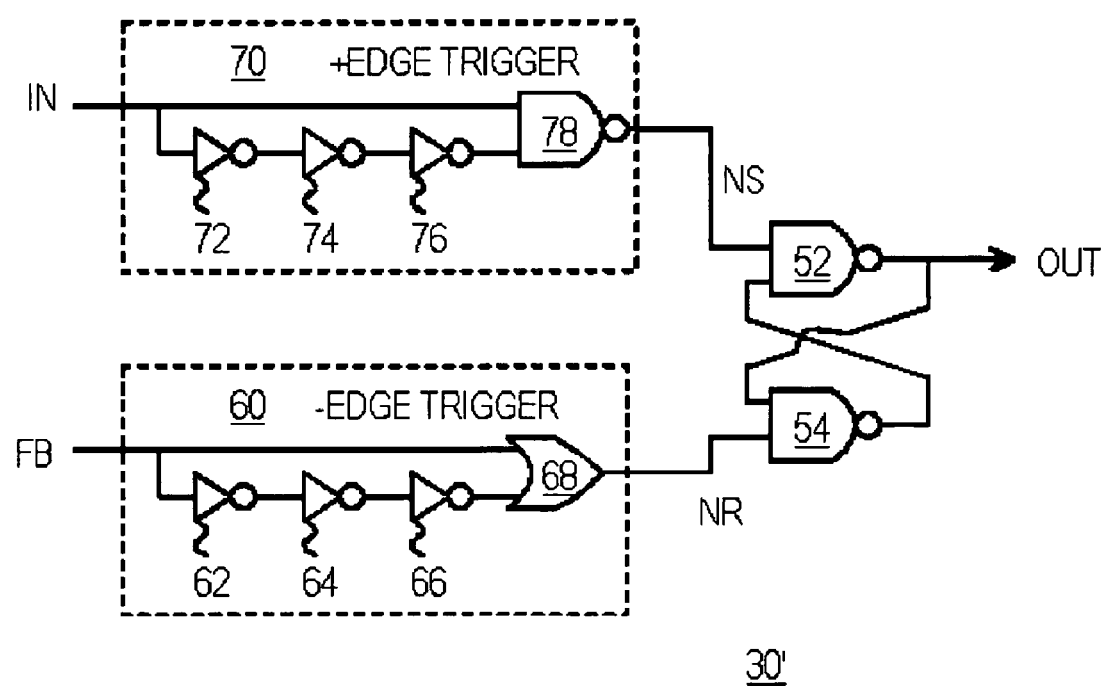
FIG. 5 is a schematic of an edge-triggered SR flip-flop.

FIG. 5 is a schematic of an edge-triggered SR flip-flop. SR flip-flop 30' retains its state when inputs IN, FB do not change since NAND gates 52, 54 are cross-coupled. NAND gates 52, 54 form an SR latch.

Edge trigger circuit 70 generates a low-going pulse on input NS to NAND gate 52 when input IN goes from low to high. The low pulse from edge trigger circuit 70 is generated when both inputs to NAND gate 78 are high, which occurs for a short time after input IN goes from low to high, but before that change propagates through inverters 72, 74, 76 to NAND gate 78. The delays and numbers of inverters can be changed during design to adjust the low pulse width generated by edge trigger circuit 70.

Edge trigger circuit 60 generates a low-going pulse on input NR to NAND gate 54 when feedback input FB goes from high to low. The low pulse from edge trigger circuit 60 is generated when both inputs to OR gate 68 are low, which occurs for a short time after feedback input FB goes from high to low, but before that change propagates through inverters 62, 64, 66 to OR gate 68. The delays and numbers of inverters can be changed during design to adjust the low pulse width generated by edge trigger circuit 60. Note that the inversion of inverter 28 of FIG. 3 has been incorporated into edge trigger circuit 60 for SR flip-flop 30' in this embodiment.

Figure 6:
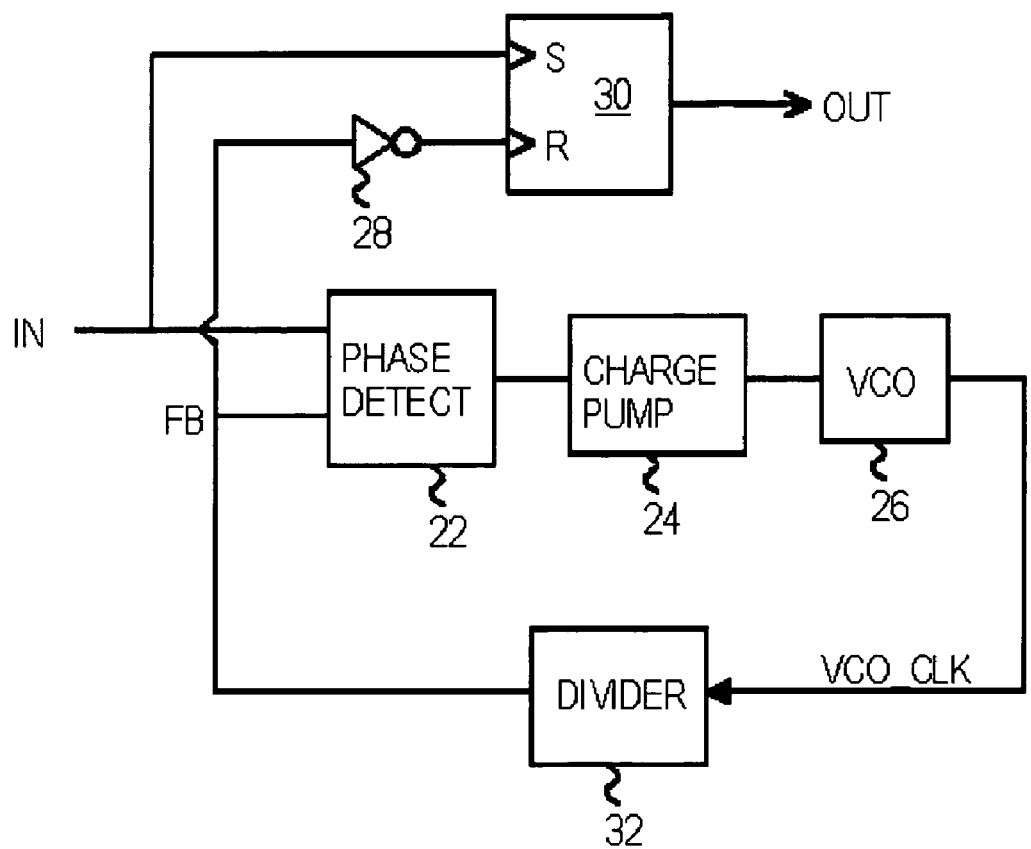
FIG. 6 shows a feedback divider in the PLL, which operates at a higher internal frequency.

FIG. 6 shows a feedback divider in the PLL, which operates at a higher internal frequency. The feedback clock FB may be generated by counter 32 rather than directly by VCO 26. The VCO output clock may operate at a multiple of the feedback and input clocks. For example, VCO 26 may operate at four times the frequency of input clock IN, and counter 32 divides by four to generate feedback clock FB.

The higher internal frequency of VCO may be desirable in some embodiments. For example, if the VCO had a poor duty cycle, running the VCO at a higher frequency may be useful to improve the duty cycle, since the VCO frequency is divided down by the feedback counter. The higher VCO frequency can increase power consumption though. Phase noise may be reduced by using a higher internal VCO frequency.

Since SR flip-flop 30 still receives the feedback clock FB that is the same frequency as input clock IN, the operation of SR flip-flop 30 is the same, despite the higher internal frequency of VCO 26 and the use of counter 32.

Figure 7:
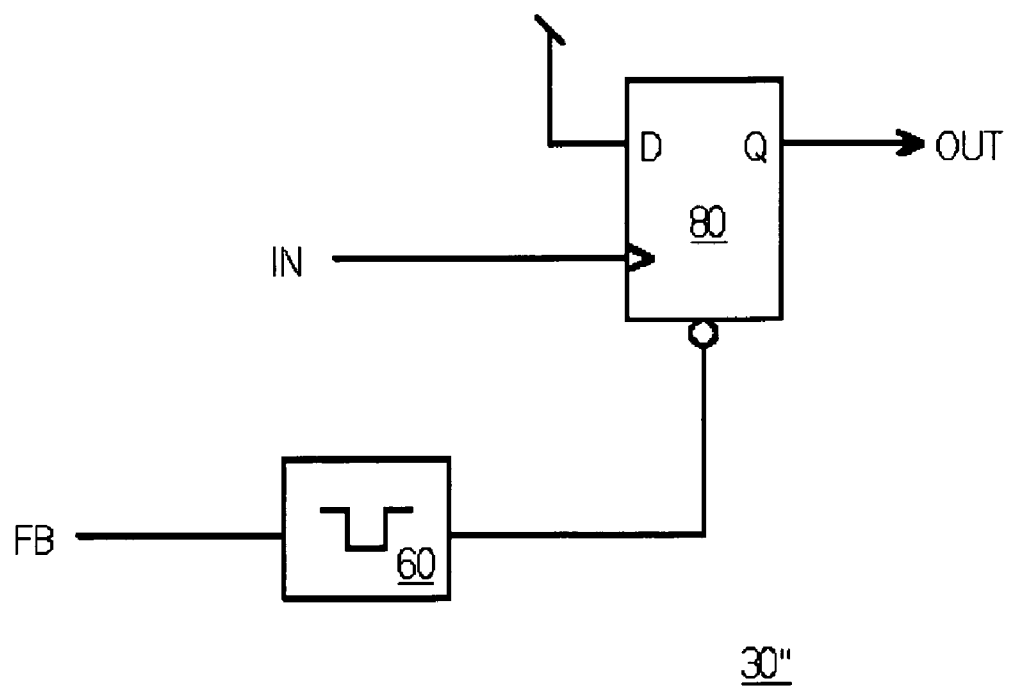
FIG. 7 shows a D-type flip-flop used to generate the duty-cycle-corrected clock.

FIG. 7 shows a D-type flip-flop used to generate the duty-cycle corrected clock. Rather than use an SR flip-flop, a D-type flip-flop may be used. SR flip-flop 30" includes D flip-flop 80, which has its D-input tied high. The input clock IN is applied to the clock input of D flip-flop 80, while the reset input of D flip-flop 80 receives a low-going pulse generated by edge trigger circuit 60 shown in FIG. 5.

On the rising edge of input clock IN, the high on the D input of D flip-flop 80 is clocked to the Q output, which is the output clock OUT. The VCO generates the falling edge of the feedback clock FB so that the duty cycle is 50%, while the rising edge of FB is phase aligned to the rising edge of input clock IN. On the falling edge of feedback clock FB, edge trigger circuit 60 generates a low-going pulse, which resets D flip-flop 80, causing its Q output to go low. Thus output clock OUT goes high in response to input clock IN rising, and goes low in response to feedback clock FB falling.

ALTERNATE EMBODIMENTS

Several other embodiments are contemplated by the inventors. For example a digital PLL without an analog filter and VCO may be used. The digital PLL could use a multiplexer to select from multi-phase clocks to substitute for the VCO. A delay line or delay-locked loop (DLL) could also be substituted for the PLL. Various kinds of PLL's could be used, such as tracking PLL's, resetable PLL's, etc.

The charge pump, phase comparator, VCO, SR flip-flop, edge trigger circuits, etc. can be implemented by a variety of circuits and technologies. Various filters can be used for generating or averaging the VCO input voltage, such as filters with inductances, series resistances, or parallel legs. Additional PLL loops can be added, and more complex circuits can be substituted. Feedback counters may divide by one rather than a larger divisor.

Some delays and frequency offsets may be present in actual circuits and visible empirically or by simulation, and may be adjusted by trimming values or by other methods. Leading edges can be rising or falling, while trailing edges are opposite in polarity to the leading edges (falling or rising). Duty cycles can be defined as the percentage of the clock period between the leading and trailing edges, or may be defined in other ways.

Various logical substitutions may be made using DeMorgan's theorem or other Boolean manipulations, and inversions and buffering may be added or reduced at different locations. The feedback clock or input clock could be buffered or inverted and include several circuit nodes that are basically the same clock.

Other kinds of SR flip-flops could be used, such as J-K flip-flops, Toggle flip-flops, settable, clearable bi-stable elements, master-slave devices, etc. Various logical inversions may be added, so that a set signal or input may set the flip-flop to a first state that is low rather than high, and a reset could set the flip-flop to a second state that is high rather than low.

While a 50% duty cycle has been described as ideal, other desired duty cycles could be generated. For example, when a 30% duty cycle is desired, the VCO could be designed to generate the trailing edge of the feedback clock after 30% of the clock period. Then the output clock could have a 30% duty cycle as the target duty cycle. Physical circuit delays may change the actual duty cycle somewhat.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claims elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A duty-cycle-correcting clock generator comprising:
   a phase-locked loop (PLL) that generates a feedback clock, the PLL having a phase comparator that compares phases of an input clock and the feedback clock, the PLL adjusting a frequency of the feedback clock in response to phase comparison; and
   a clock toggler that receives the input clock and receives the feedback clock generated by the PLL, the clock toggler generating an output clock;
   wherein the clock toggler generates leading edges of the output clock in response to leading edges of the input clock;
   wherein the clock toggler generates trailing edges of the output clock in response to trailing edges of the feedback clock;
   wherein the clock toggler comprises:
      a flip-flop that receives the input clock at a clock input and generates the output clock;
      an edge trigger circuit that receives the feedback clock and generates a reset pulse in response to a trailing edge of the feedback clock;
      wherein the reset pulse is applied to a reset input of the flip-flop;
      wherein the flip-flop is set by the input clock to generate a leading edge of the output clock and reset by the reset pulse to generate the trailing edge of the output clock;
   wherein the PLL creates PLL noise that is included in the feedback clock but is not present in the input clock;
   wherein PLL noise is propagated to trailing edges of the output clock while leading edges of the output clock do not include PLL noise,
   whereby trailing edges of the output clock are generated by the PLL, and leading edges are generated by the input clock that bypasses the PLL and whereby duty cycle of the output clock is adjusted without PLL noise being added to leading edges of the output clock.

2. The duty-cycle-correcting clock generator of claim 1 wherein the PLL comprises the phase comparator that receives the input clock and the feedback clock, the PLL further comprising:
   a filter capacitance for filtering a control voltage;
   a charge pump that charges and discharges the filter capacitance in response to phase comparisons by the phase comparator; and
   a voltage-controlled oscillator (VCO) that generates the feedback clock having a frequency responsive to the control voltage.

3. The duty-cycle-correcting clock generator of claim 2 wherein the VCO operates at a higher frequency than the feedback clock.

4. The duty-cycle-correcting clock generator of claim 2 wherein the VCO further comprises:
   a feedback counter, coupled to receive an oscillator clock generated by the VCO, for generating the feedback clock;
   wherein the oscillator clock has a frequency that is an integer multiple of a frequency of the feedback clock.

5. The duty-cycle-correcting clock generator of claim 2 wherein the clock toggler is a D-type flip-flop, a toggle flip-flop, a J-K flip-flop, or an edge-triggered set-reset SR flip-flop.

6. The duty-cycle-correcting clock generator of claim 2 wherein the clock toggler comprises:
   a first edge trigger circuit that receives the input clock and generates a first pulse in response to a leading edge of the input clock;
   a second edge trigger circuit that receives the feedback clock and generates a second pulse in response to a trailing edge of the feedback clock;
   a latch that is set by the first pulse and reset by the second pulse to generate the output clock.

7. The duty-cycle-correcting clock generator of claim 6 wherein the latch is a set-reset latch having cross-coupled logic gates.

8. The duty-cycle-correcting clock generator of claim 1 wherein the flip-flop is a D-type flip-flop having a data input connected to a fixed voltage.

9. The duty-cycle-correcting clock generator of claim 1 wherein the input clock has a duty cycle that is less than 40% or more than 60%;
   wherein the feedback clock and the output clock have duty cycles that are between 45% and 55%,
   whereby duty cycle is improved.

* * * * *